United States Patent
Shen et al.

(10) Patent No.: US 11,430,893 B2
(45) Date of Patent: Aug. 30, 2022

(54) METHOD OF MANUFACTURING A SEMICONDUCTOR DEVICE AND A SEMICONDUCTOR DEVICE

(71) Applicant: TAIWAN SEMICONDUCTOR MANUFACTURING CO., LTD., Hsinchu (TW)

(72) Inventors: Yan-Ting Shen, Hsinchu (TW); Chia-Chi Yu, Hsinchu (TW); Chih-Teng Liao, Hsinchu (TW); Yu-Li Lin, Kaohsiung (TW); Chih Hsuan Cheng, Houlong Township (TW); Tzu-Chan Weng, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/926,521

(22) Filed: Jul. 10, 2020

(65) Prior Publication Data

US 2022/0013662 A1    Jan. 13, 2022

(51) Int. Cl.
| | |
|---|---|
| *H01L 29/78* | (2006.01) |
| *H01L 21/8234* | (2006.01) |
| *H01L 29/06* | (2006.01) |
| *H01L 29/417* | (2006.01) |
| *H01L 29/66* | (2006.01) |

(52) U.S. Cl.
CPC .... *H01L 29/785* (2013.01); *H01L 21/823431* (2013.01); *H01L 29/0649* (2013.01); *H01L 29/41791* (2013.01); *H01L 29/66795* (2013.01); *H01L 2029/7858* (2013.01)

(58) Field of Classification Search
CPC ........... H01L 29/785; H01L 21/823431; H01L 29/41791; H01L 29/66795; H01L 29/0649; H01L 2029/7858
USPC .......................................................... 257/365
See application file for complete search history.

(56) References Cited

U.S. PATENT DOCUMENTS

| | | | | |
|---|---|---|---|---|
| 5,268,200 A | * | 12/1993 | Steger | H01J 37/32495 427/249.17 |
| 7,204,913 B1 | * | 4/2007 | Singh | H01J 37/32862 156/345.55 |
| 2002/0086118 A1 | * | 7/2002 | Chang | H01J 37/32477 428/458 |
| 2003/0145299 A1 | | 7/2003 | Fried | |
| 2004/0002299 A1 | * | 1/2004 | Lin | H01L 21/67017 414/935 |

(Continued)

FOREIGN PATENT DOCUMENTS

| | | |
|---|---|---|
| JP | 2003-264232 A | 9/2003 |
| KR | 10-2013-0109909 A | 10/2013 |

(Continued)

*Primary Examiner* — Mohammad M Hoque
(74) *Attorney, Agent, or Firm* — McDermott Will & Emery LLP

(57) ABSTRACT

A semiconductor device includes a fin structure protruding from an isolation insulating layer disposed over a substrate and having a channel region, a source/drain region disposed over the substrate, a gate dielectric layer disposed on the channel region, and a gate electrode layer disposed on the gate dielectric layer. The gate electrode includes a lower portion below a level of a top of the channel region and above an upper surface of the isolation insulating layer, and a width of the lower portion is not constant.

20 Claims, 15 Drawing Sheets

(56) References Cited

U.S. PATENT DOCUMENTS

| | | |
|---|---|---|
| 2004/0084409 A1 | 5/2004 | Deshmukh et al. |
| 2005/0155625 A1* | 7/2005 | Jangjian ............... B08B 7/00 134/1.1 |
| 2005/0155710 A1* | 7/2005 | Tseng ............ H01L 21/67126 156/345.32 |
| 2005/0214455 A1* | 9/2005 | Li .................... C23C 16/4404 427/248.1 |
| 2011/0076832 A1* | 3/2011 | Huang ............... H01L 21/3081 438/424 |
| 2011/0207332 A1* | 8/2011 | Liu .................. H01J 37/32623 438/719 |
| 2011/0226734 A1* | 9/2011 | Sumiya ............. H01L 21/3065 216/41 |
| 2013/0256764 A1 | 10/2013 | Liaw |
| 2014/0170842 A1 | 6/2014 | Noro et al. |
| 2014/0183599 A1* | 7/2014 | Hong ................ H01L 29/7848 257/190 |
| 2014/0302678 A1 | 10/2014 | Paterson et al. |
| 2016/0111531 A1 | 4/2016 | Dong |
| 2017/0005005 A1* | 1/2017 | Chen ............... H01L 21/823431 |
| 2017/0005165 A1* | 1/2017 | Chen ................ H01L 21/32137 |
| 2017/0256416 A1* | 9/2017 | Fischer ............ H01L 21/30655 |
| 2018/0151353 A1* | 5/2018 | Lin .................. H01L 21/02129 |
| 2018/0173096 A1* | 6/2018 | Zi ........................ G03F 7/0042 |
| 2018/0269070 A1 | 9/2018 | Eason et al. |
| 2019/0035916 A1 | 1/2019 | Chiu et al. |
| 2019/0103325 A1* | 4/2019 | Huang ................ H01L 29/0847 |
| 2019/0148490 A1* | 5/2019 | Fung ............... H01L 21/02381 257/347 |
| 2019/0371915 A1 | 12/2019 | Liao et al. |
| 2020/0173022 A1* | 6/2020 | Han .................... C23C 16/4584 |

FOREIGN PATENT DOCUMENTS

| | | |
|---|---|---|
| KR | 10-2014-0121786 A | 10/2014 |
| KR | 10-2016-0044976 A | 4/2016 |
| KR | 10-1820226 B1 | 1/2018 |
| KR | 10-2018-0105072 A | 9/2018 |
| KR | 10-2019-0013403 A | 2/2019 |

\* cited by examiner

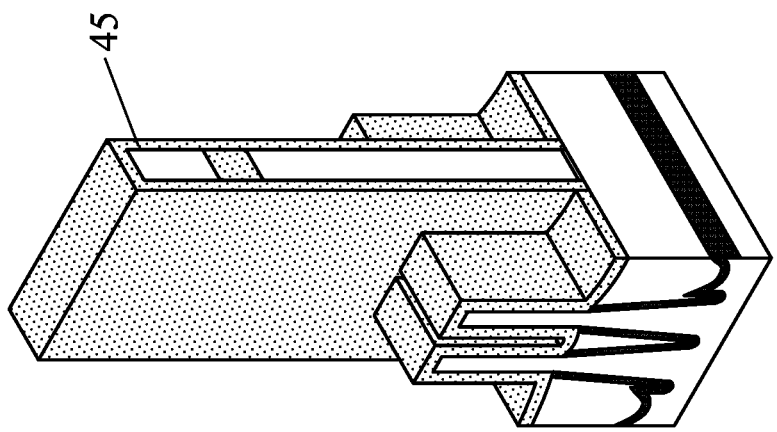
FIG. 8
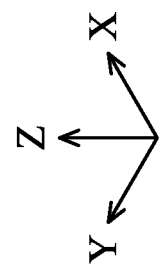
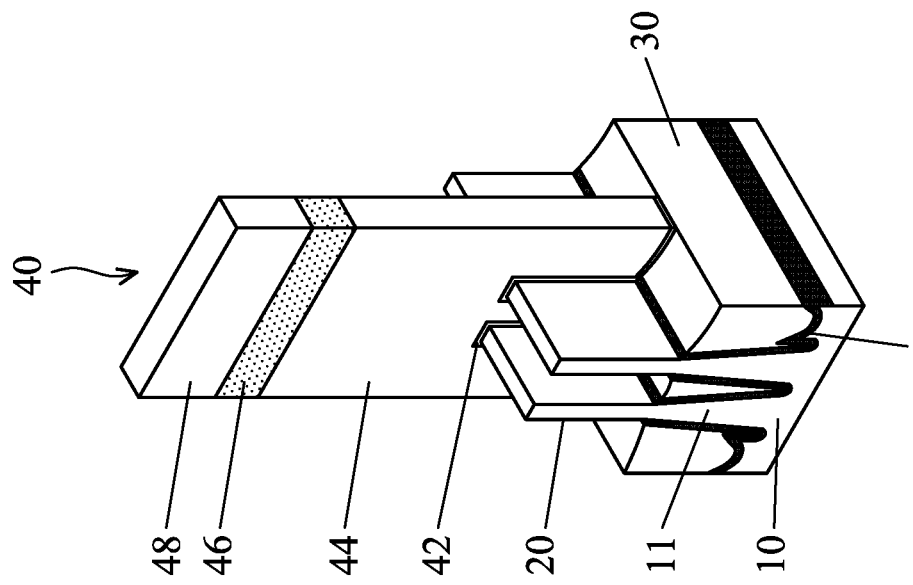
FIG. 7
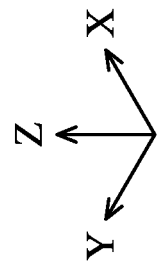

| Power (W) | Pressure (mT) | Gas(sccm) | | | Time(s) |
|---|---|---|---|---|---|
| 550 | Tuning item | O2 | Ar | SiCl4 | 19 |
| | | 200 | 200 | 80 | |

| SiCl4 to O2 ratio | Coating film trim rate(A/s) | Average Coating film Thickness(nm) | Coating film Uniformity(%) | Profile | A : B : C |
|---|---|---|---|---|---|
| ① 0.05~0.2 | 3~7 A/s | 10~50nm | 22~33% | | 1 : 0.94 : 0.96 |
| ② 0.2~0.4 | 7~15A/s | 50~80 nm | 30~40% | | 1 : 0.99 : 1 |
| ③ 0.4~0.6 | 17~25 A/s | 80~150 nm | 37~52% | | 1 : 1.10 : 1.14 |

FIG. 21

| Power (W) | Pressure (mT) | Gas(sccm) | | | Time(s) |
|---|---|---|---|---|---|
| | | O2 | Ar | SiCl4 | |
| 550 | 30 | 200 | 200 | Tuning item | 19 |

| SiCl4 to O2 ratio | Coating film trim rate(A/s) | Average Coating film Thickness(nm) | Coating film Uniformity(%) | Profile | A : B : C |
|---|---|---|---|---|---|
| ④ 0.05~0.2 | 3~7 A/s | 10~50nm | 22~33% | | 1 : 0.94 : 0.96 |
| ⑤ 0.2~0.4 | 7~15A/s | 50~80 nm | 30~40% | | 1 : 0.99 : 1 |
| ⑥ 0.4~0.6 | 17~25 A/s | 80~150 nm | 37~52% | | 1 : 1.10 : 1.14 |

FIG. 22

| Condition | ①④ | ②⑤ | ③⑥ |
|---|---|---|---|
| Poly profile | (tapered narrowing) | (straight) | (tapered widening) |
| B/A ratio | 0.92~0.94 | 0.98~1.0 | 1.08~1.16 |
| A:B:C | 1 : 0.93 : 0.95 | 1 : 0.99 : 0.99 | 1 : 1.12 : 1.16 |
| Gate space profile | (widening gap) | (straight gap) | (narrowing gap) |
| B/A ratio | 0.83~0.91 | 0.90~1.04 | 1.04~1.24 |
| A:B:C | 1 : 0.87 : 0.96 | 1 : 0.97 : 1 | 1 : 1.14 : 1.23 |
| Metal gate profile | (tapered narrowing) | (straight) | (tapered widening) |
| B/A ratio | 0.738~0.81 | 0.95~1.09 | 1.17~1.27 |
| A:B:C | 1 : 0.77 : 0.85 | 1 : 1.02 : 1.07 | 1 : 1.22 : 1.25 |

FIG. 23

METHOD OF MANUFACTURING A SEMICONDUCTOR DEVICE AND A SEMICONDUCTOR DEVICE

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. In a Fin FET, a gate electrode is adjacent to three side surfaces of a channel region with a gate dielectric layer interposed therebetween. A gate electrode of a FinFET includes one of more layers of metallic material formed by a gate replacement technology.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 7 shows one of the stages of a sequential process for manufacturing a FET device according to an embodiment of the present disclosure.

FIG. 8 shows one of the stages of a sequential process for manufacturing a FET device according to an embodiment of the present disclosure.

FIGS. 21 and 22 show various conditions for forming a coating material layer according to embodiments of the present disclosure.

FIG. 23 shows conditions for forming a coating material layer and resultant structures according to embodiments of the present disclosure.

DETAILED DESCRIPTION

Figure 2:
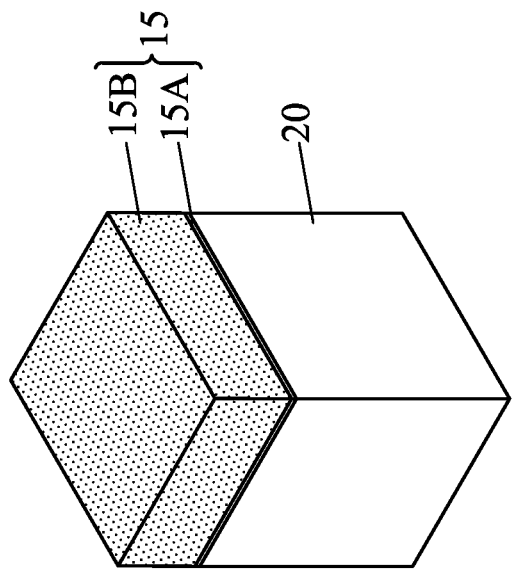
FIG. 2 shows one of the stages of a sequential process for manufacturing a FET device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

In a gate replacement technology, a sacrificial gate structure including a sacrificial gate electrode (made of, for example, polysilicon) is first formed over a channel region and subsequently is replaced with a metal gate structure. In metal gate FinFETs, device performance is affected by a metal gate profile (shape) design, and the metal gate profile is often dependent on the profile of a sacrificial gate electrode. However, if the etching process for patterning the polysilicon sacrificial gate electrode varies or is not well-controlled, the profile, shape, and/or dimensions of the polysilicon sacrificial gate electrode vary within a wafer or wafer-to-wafer. In particular, the wafer-to-wafer variation of the profiles of the polysilicon sacrificial gate electrode would result in a low yield and low device performance. In the present disclosure, a method of controlling a profile (shape) of the sacrificial gate electrode is provided.

FIGS. 1-16 show a sequential process for manufacturing an FET device according to one embodiment of the present disclosure. It is understood that additional operations can be provided before, during, and after processes shown by FIGS. 1-16, and some of the operations described below can be replaced or eliminated, for additional embodiments of the method. The order of the operations/processes may be interchangeable.

Figure 1:
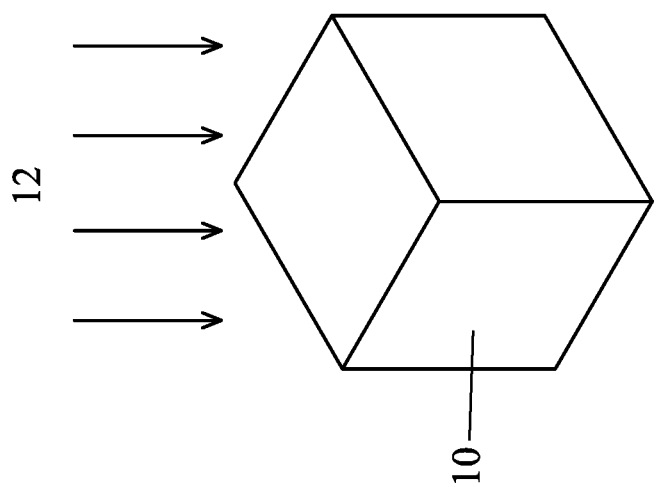
FIG. 1 shows one of the stages of a sequential process for manufacturing a FET device according to an embodiment of the present disclosure.

As shown in FIG. 1, impurity ions (dopants) 12 are implanted into a silicon substrate 10 to form a well region. The ion implantation is performed to prevent a punch-through effect.

In one embodiment, substrate 10 includes a single crystalline semiconductor layer on at least it surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 10 is made of Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

The substrate 10 may include various regions that have been suitably doped with impurities (e.g., p-type or n-type conductivity). The dopants 12 are, for example boron ($BF_2$) for an n-type Fin FET and phosphorus for a p-type Fin FET.

In FIG. 2, a mask layer 15 is formed over the substrate 10. In some embodiments, the mask layer 15 includes a first mask layer 15A and a second mask layer 15B. In some embodiments, the first mask layer 15A is made of silicon nitride and the second mask layer 15B is made of a silicon oxide. In other embodiments, the first mask layer 15A is made of silicon oxide and the second mask layer 15B is made of silicon nitride (SiN). The first and second mask layers are formed by chemical vapor deposition (CVD), including low pressure CVD (LPCVD) and plasma enhanced CVD (PECVD), physical vapor deposition (PVD), atomic layer deposition (ALD), or other suitable process. The mask layer 15 is patterned into a mask pattern by using patterning operations including photo-lithography and etching.

Figure 3:
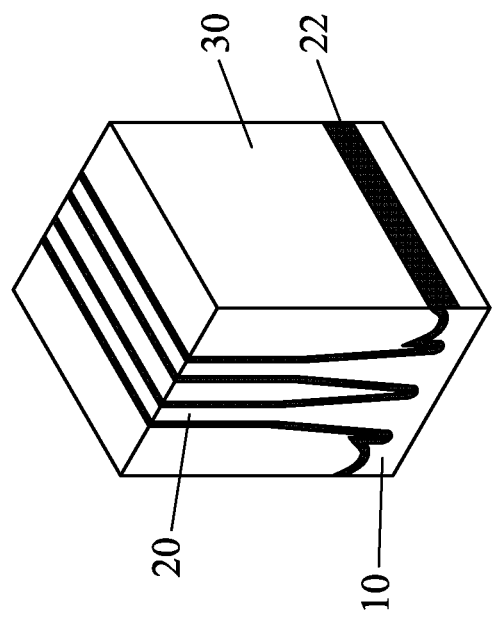
FIG. 3 shows one of the stages of a sequential process for manufacturing a FET device according to an embodiment of the present disclosure.

Next, as shown in FIG. 3, the substrate 10 is patterned by using the patterned mask layer 15 into fin structures 25 extending in the X direction. In FIG. 3, two fin structures 25 are arranged in the Y direction. But the number of the fin structures is not limited to two, and may be as small as one and three or more. In some embodiments, one or more dummy fin structures are formed on both sides of the fin structures 25 to improve pattern fidelity in the patterning operations.

The fin structures 25 may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

After the fin structure is formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. An anneal operation may be performed after the formation of the insulating layer. Then, a planarization operation, such as a chemical mechanical polishing (CMP) method and/or an etch-back method, is performed such that the upper surface of the uppermost second semiconductor layer 25 is exposed from the insulating material layer 30 as shown in FIG. 4.

Figure 4:
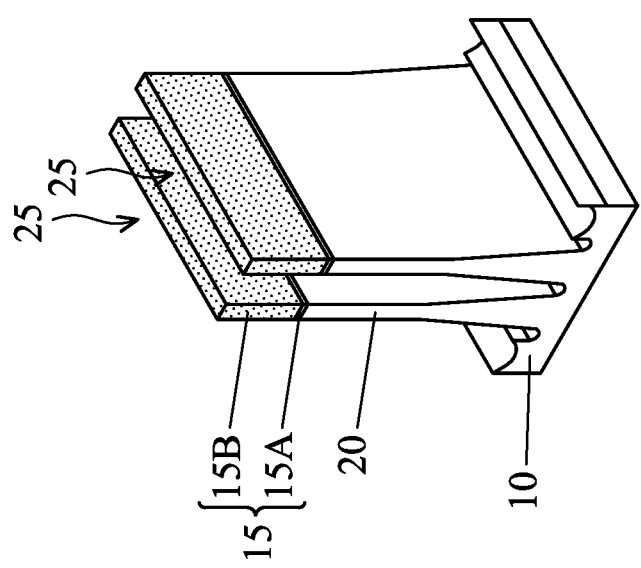
FIG. 4 shows one of the stages of a sequential process for manufacturing a FET device according to an embodiment of the present disclosure.

In some embodiments, one or more liner layers 22 are formed over the structure of FIG. 3 before forming the insulating material layer 30, as shown FIG. 4. The liner layer 22 includes one or more of silicon nitride, SiON, SiCN, SiOCN, and silicon oxide.

Figure 5:
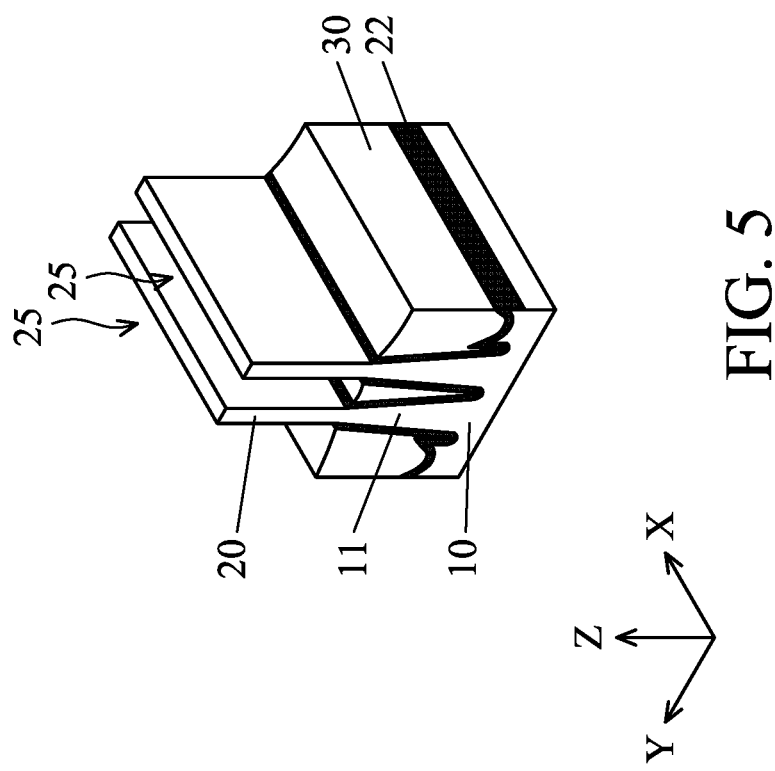
FIG. 5 shows one of the stages of a sequential process for manufacturing a FET device according to an embodiment of the present disclosure.

Then, as shown in FIG. 5, the insulating material layer 30 is recessed to form an isolation insulating layer 30 so that the upper portions of the fin structures 20 are exposed. With this operation, the fin structures 25 are electrically separated from each other by the isolation insulating layer 30, which is also called a shallow trench isolation (STI). The lower portion 11 of the fin structure is embedded in the isolation insulating layer 30.

Figure 6:
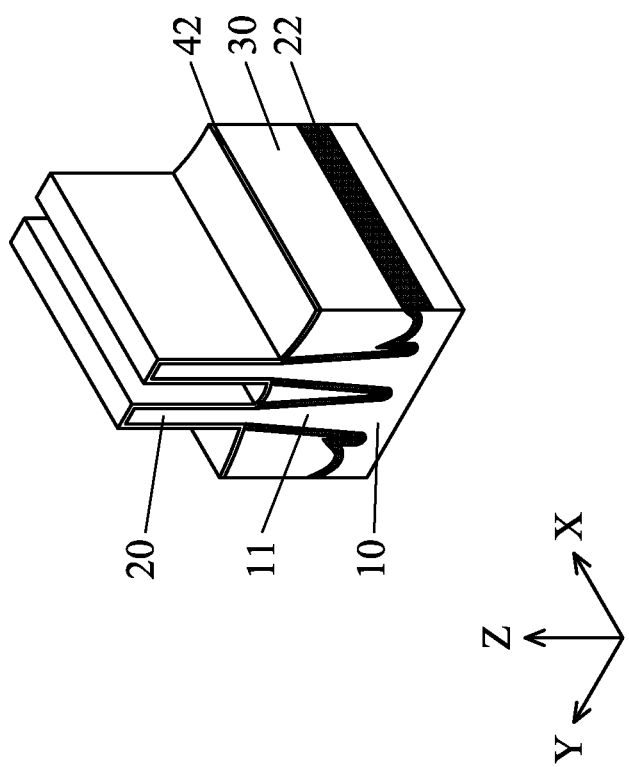
FIG. 6 shows one of the stages of a sequential process for manufacturing a FET device according to an embodiment of the present disclosure.

After the isolation insulating layer 30 is formed, a sacrificial gate dielectric layer 42 is formed, as shown in FIG. 6. The sacrificial gate dielectric layer 42 includes one or more layers of insulating material, such as a silicon oxide-based material. In one embodiment, silicon oxide formed by CVD is used. The thickness of the sacrificial gate dielectric layer 42 is in a range from about 1 nm to about 5 nm in some embodiments.

FIG. 7 illustrates a structure after a sacrificial gate structure 40 is formed over the exposed fin structures 25. The sacrificial gate structure includes a sacrificial gate electrode 44 and the sacrificial gate dielectric layer 42. The sacrificial gate structure 40 is formed over a portion of the fin structure which is to be a channel region. The sacrificial gate structure 40 is formed by first blanket depositing the sacrificial gate dielectric layer 42 over the fin structures, as shown in FIG. 7. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad SiN layer 46 and a silicon oxide mask layer 48.

Next, a patterning operation is performed on the mask layer and sacrificial gate electrode layer is patterned into the sacrificial gate structure 40, as shown in FIG. 7. The patterning operations of sacrificial gate structure 40 will be explained below in more detail.

The sacrificial gate structure 40 includes the sacrificial gate dielectric layer 42, the sacrificial gate electrode layer 44 (e.g., poly silicon), the pad SiN layer 46 and the silicon oxide mask layer 48 in some embodiments. By patterning the sacrificial gate structure 40, the upper portions of the fin structures 20 are partially exposed on opposite sides of the sacrificial gate structure 40, thereby defining source/drain (S/D) regions, as shown in FIG. 7. In this disclosure, a source and a drain are interchangeably used and the structures thereof are substantially the same. In FIG. 7, one sacrificial gate structure is formed, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

After the sacrificial gate structure 40 is formed, a blanket layer 45 of an insulating material for sidewall spacers 45 is conformally formed by using CVD or other suitable methods, as shown in FIG. 8. The blanket layer 45 is deposited in a conformal manner so that it is formed to have substantially equal thicknesses on vertical surfaces, such as the sidewalls, horizontal surfaces, and the top of the sacrificial gate structure. In some embodiments, the blanket layer 45 is deposited to a thickness in a range from about 2 nm to about 10 nm. In one embodiment, the insulating material of the blanket layer 45 is a silicon nitride-based material, such as SiN, SiON, SiOCN or SiCN and combinations thereof.

Figure 9:
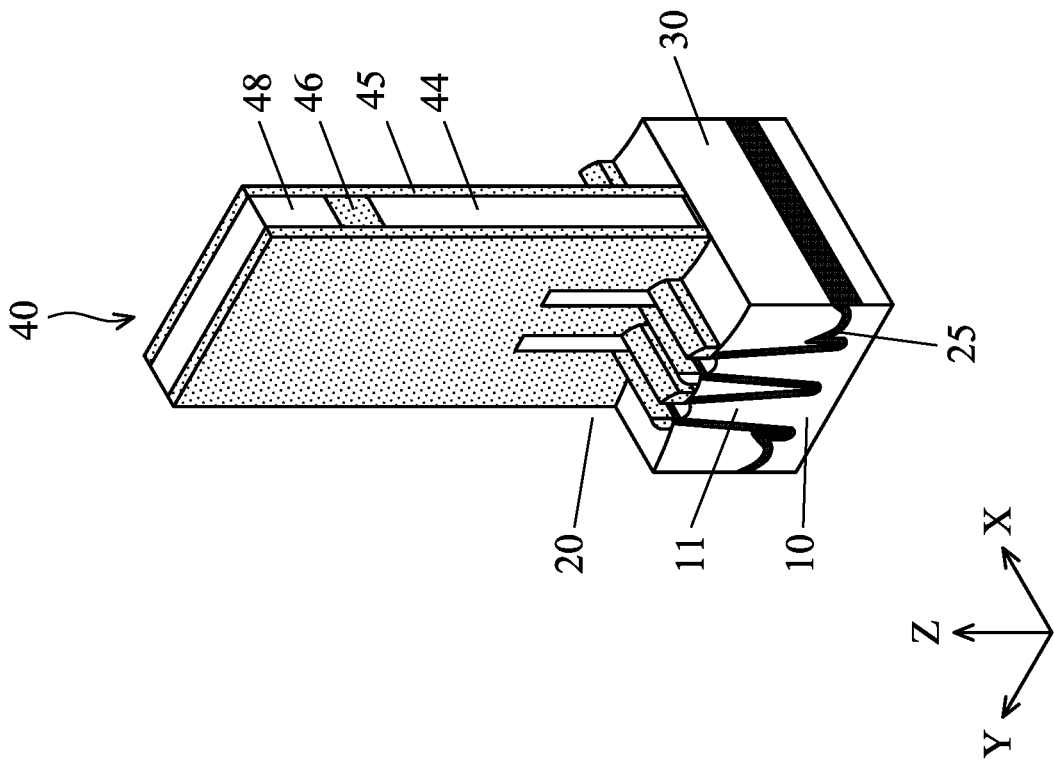
FIG. 9 shows one of the stages of a sequential process for manufacturing a FET device according to an embodiment of the present disclosure.

Further, as shown in FIG. 9, sidewall spacers 45 are formed on opposite sidewalls of the sacrificial gate structures, and subsequently, the fin structures of the S/D regions are recessed down below the upper surface of the isolation insulating layer 30. After the blanket layer 45 is formed, anisotropic etching is performed on the blanket layer 45 using, for example, reactive ion etching (RIE). During the anisotropic etching process, most of the insulating material is removed from horizontal surfaces, leaving the dielectric spacer layer on the vertical surfaces such as the sidewalls of the sacrificial gate structures and the sidewalls of the exposed fin structures. The mask layer 48 may be exposed from the sidewall spacers. In some embodiments, isotropic etching may be subsequently performed to remove the insulating material from the upper portions of the S/D region of the exposed fin structures 25.

Subsequently, the fin structures of the S/D regions are recessed down below the upper surface of the isolation insulating layer 30, by using dry etching and/or wet etching. As shown in FIG. 9, the sidewall spacers 45 formed on the S/D regions of the exposed fin structures (fin sidewalls) partially remain. In other embodiments, however, the sidewall spacers 45 formed on the S/D regions of the exposed fin structures are fully removed.

Figure 10:
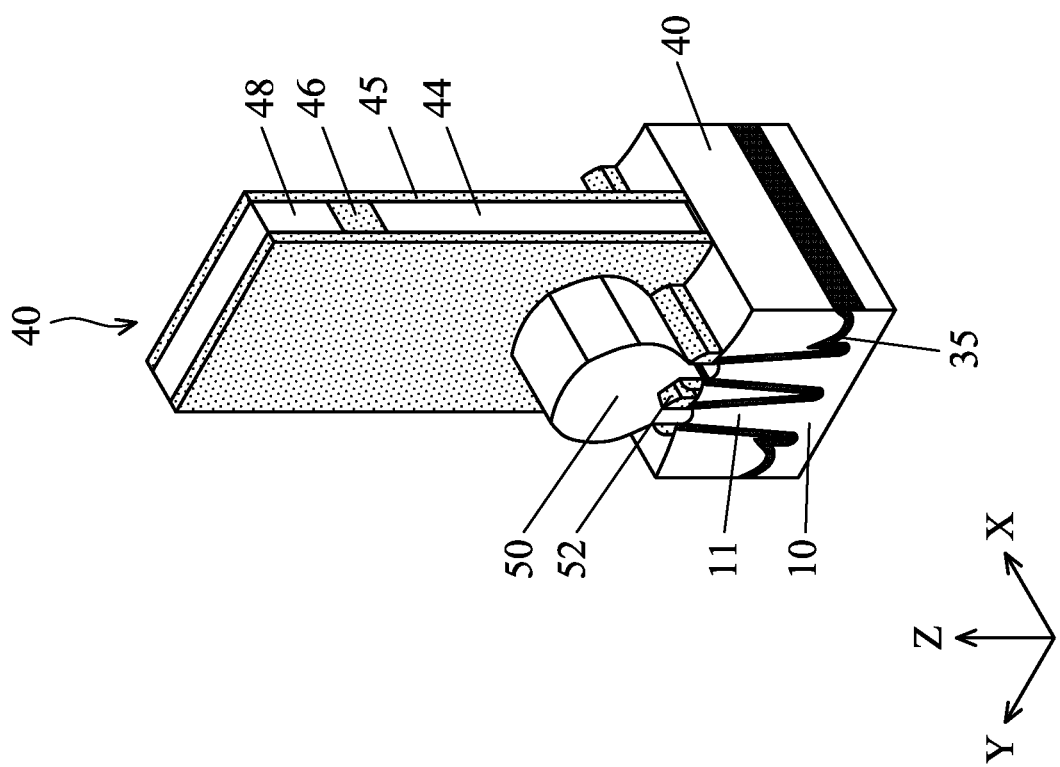
FIG. 10 shows one of the stages of a sequential process for manufacturing a FET device according to an embodiment of the present disclosure.

Subsequently, as shown in FIG. 10, source/drain (S/D) epitaxial layers 50 are formed. The S/D epitaxial layer 50 includes one or more layers of Si, SiP, SiC and SiCP for an n-channel FET or Si, SiGe, Ge, GeSn and SiGeSn for a p-channel FET. The S/D layers 50 are formed by an epitaxial growth method using CVD, ALD or molecular beam epitaxy (MBE).

As shown in FIG. 10, the S/D epitaxial layers grow from the recessed fin structures respectively. The grown epitaxial layers merge above the isolation insulating layer and form a void 52 in some embodiments.

Figure 11:
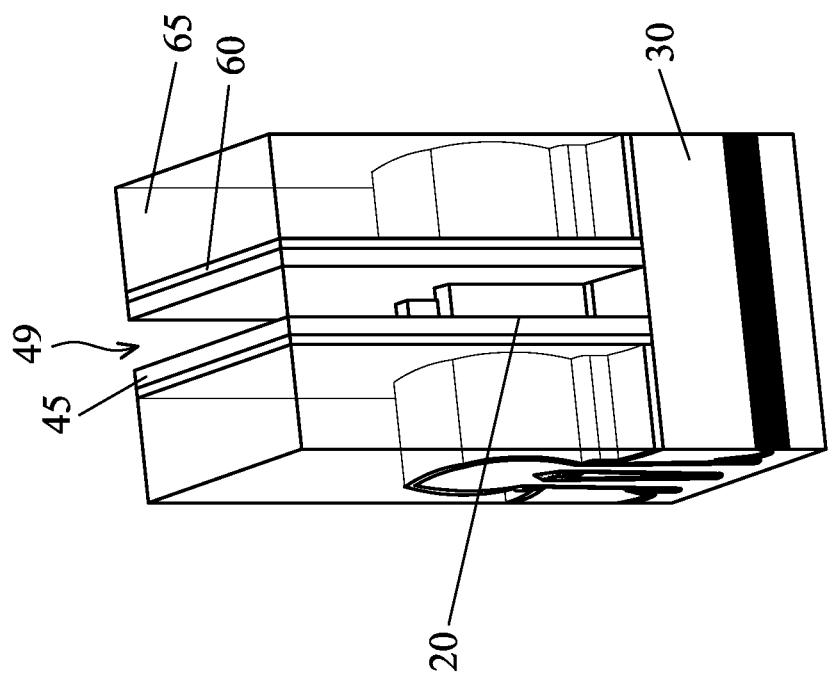
FIG. 11 shows one of the stages of a sequential process for manufacturing a FET device according to an embodiment of the present disclosure.

Subsequently, an insulating liner layer 60, as an etch stop layer, is formed and then an interlayer dielectric (ILD) layer 65 is formed, as shown in FIG. 11. The insulating liner layer 60 is made of a silicon nitride-based material, such as SiN, and functions as a contact etch stop layer in the subsequent etching operations. The materials for the ILD layer 65 include compounds comprising Si, O, C and/or H, such as silicon oxide, SiCOH and SiOC. Organic materials, such as polymers, may be used for the ILD layer 65. After the ILD layer 65 is formed, a planarization operation, such as CMP, is performed, so that the top portion of the sacrificial gate electrode layer 54 is exposed, as shown in FIG. 11.

Figure 12:
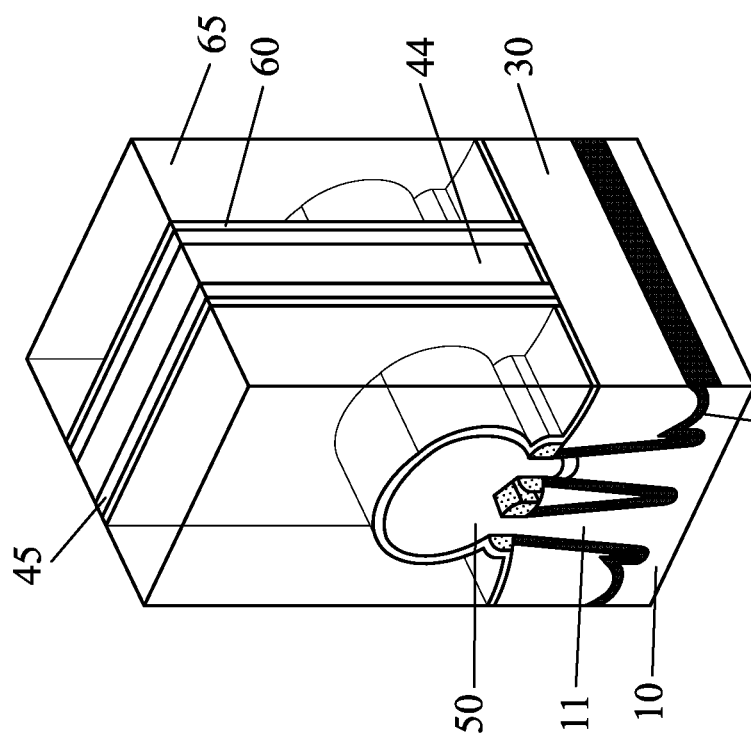
FIG. 12 shows one of the stages of a sequential process for manufacturing a FET device according to an embodiment of the present disclosure.

Next, as shown in FIG. 12, the sacrificial gate electrode layer 44 and sacrificial gate dielectric layer 42 are removed, thereby exposing the fin structures in a gate space 49. The ILD layer 65 protects the S/D structures 50 during the removal of the sacrificial gate structures. The sacrificial gate structures can be removed using plasma dry etching and/or wet etching. When the sacrificial gate electrode layer 54 is polysilicon and the ILD layer 65 is silicon oxide, a wet etchant such as a TMAH solution can be used to selectively remove the sacrificial gate electrode layer 54. The sacrificial gate dielectric layer 42 is thereafter removed using plasma dry etching and/or wet etching.

Figure 13:
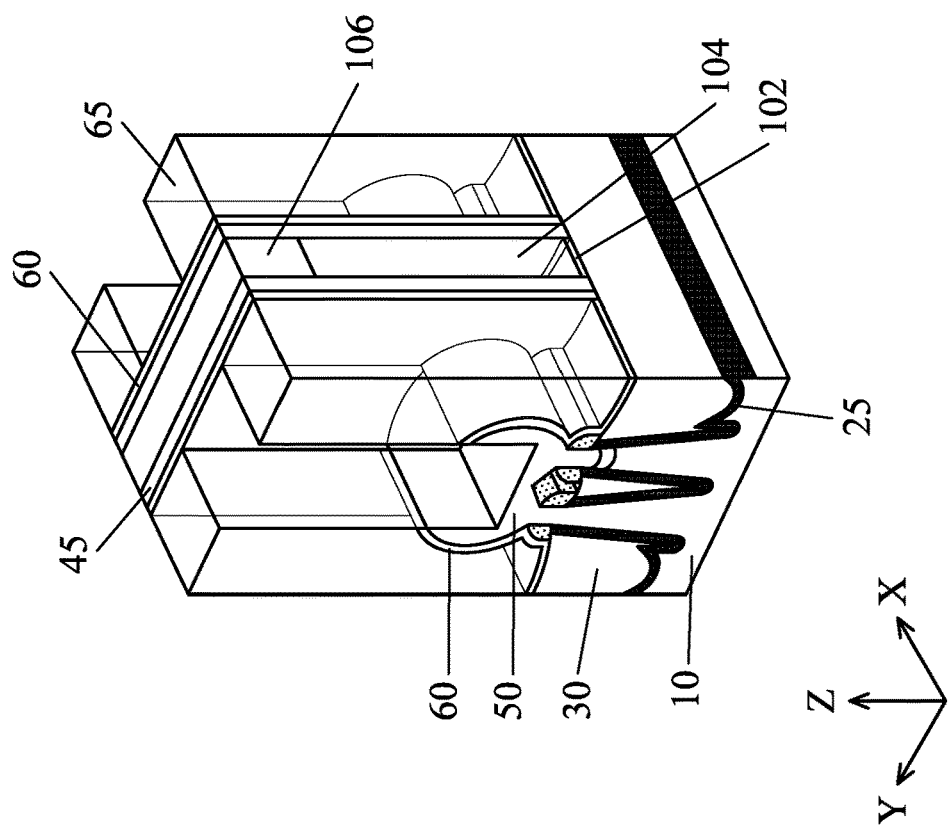
FIG. 13 shows one of the stages of a sequential process for manufacturing a FET device according to an embodiment of the present disclosure.

After the sacrificial gate structures are removed, a gate dielectric layer 102 is formed around the exposed fin structures 20, and a gate electrode layer 104 is formed on the gate dielectric layer 102, as shown in FIG. 13.

In certain embodiments, the gate dielectric layer 102 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 102 includes an interfacial layer formed between the channel layers and the dielectric material.

The gate dielectric layer 102 may be formed by CVD, ALD or any suitable method. In one embodiment, the gate dielectric layer 102 is formed using a highly conformal deposition process such as ALD in order to ensure the formation of a gate dielectric layer having a uniform thickness on the channel regions. The thickness of the gate dielectric layer 102 is in a range from about 1 nm to about 6 nm in one embodiment.

The gate electrode layer 104 is formed on the gate dielectric layer 102. The gate electrode 104 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 104 may be formed by CVD, ALD, electro-plating, or other suitable method. The gate electrode layer is also deposited over the upper surface of the ILD layer 65. The gate dielectric layer and the gate electrode layer formed over the ILD layer 65 are then planarized by using, for example, CMP, until the top surface of the ILD layer 65 is revealed.

After the planarization operation, the gate electrode layer 104 is recessed and a cap insulating layer 106 is formed over the recessed gate electrode 104, as shown in FIG. 13. The cap insulating layer includes one or more layers of a silicon nitride-based material, such as SiN. The cap insulating layer 106 can be formed by depositing an insulating material followed by a planarization operation.

In certain embodiments of the present disclosure, one or more work function adjustment layers (not shown) are interposed between the gate dielectric layer 102 and the gate electrode 104. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Figure 14:
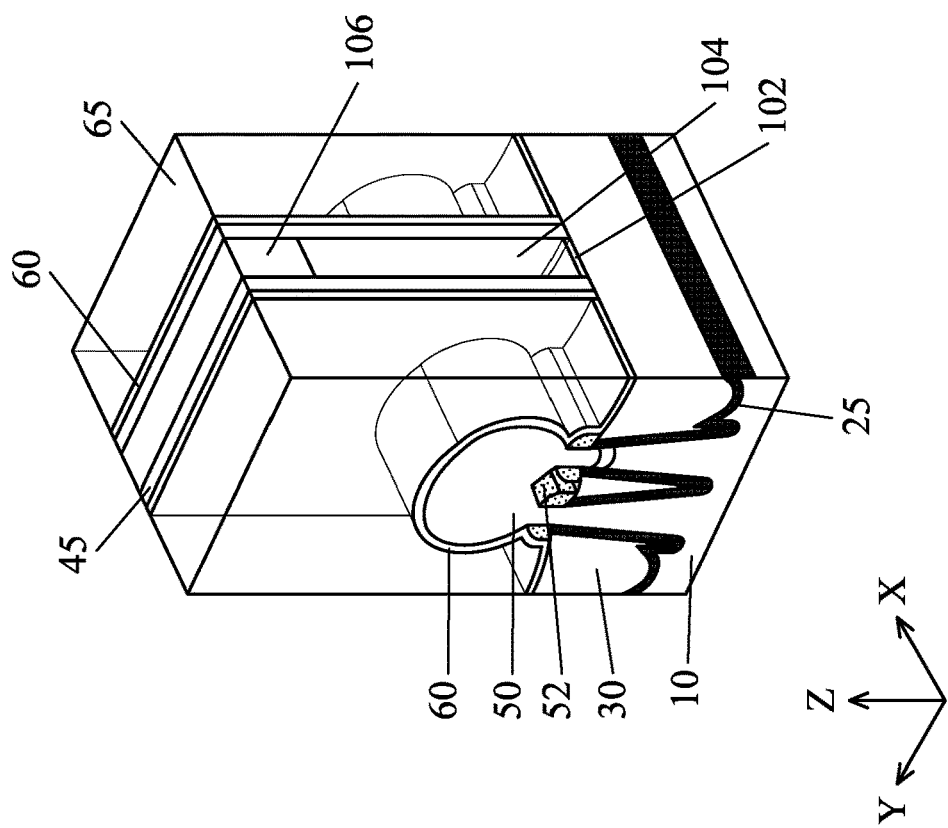
FIG. 14 shows one of the stages of a sequential process for manufacturing a FET device according to an embodiment of the present disclosure.

Subsequently, contact holes 110 are formed in the ILD layer 65 by using dry etching, as shown in FIG. 14. In some embodiments, the upper portion of the S/D epitaxial layer 50 is etched.

Figure 15:
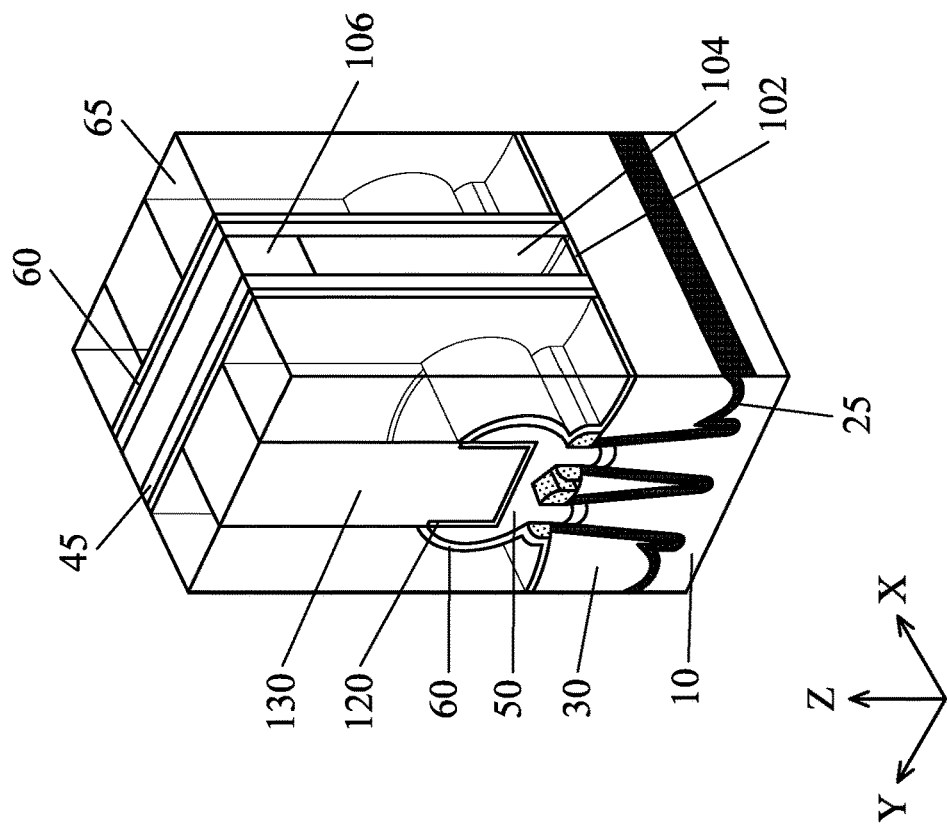
FIG. 15 shows one of the stages of a sequential process for manufacturing a FET device according to an embodiment of the present disclosure.
Figure 16:
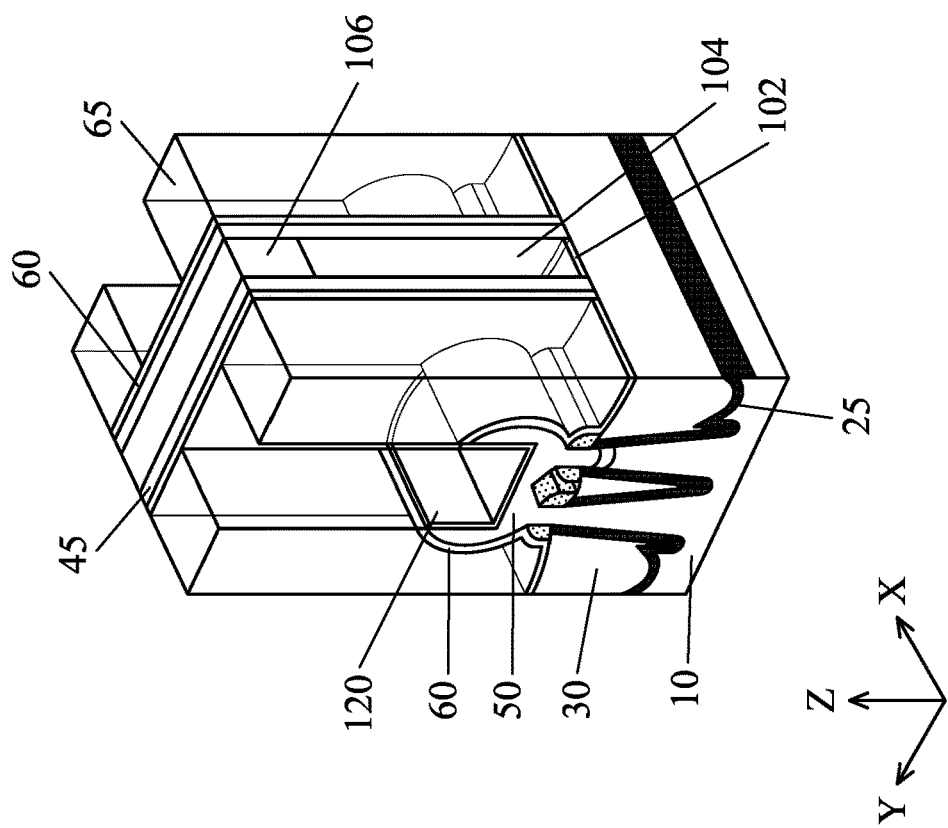
FIG. 16 shows one of the stages of a sequential process for manufacturing a FET device according to an embodiment of the present disclosure.

A silicide layer 120 is formed over the S/D epitaxial layer 50, as shown in FIG. 15. The silicide layer includes one or more of WSi, CoSi, NiSi, TiSi, MoSi and TaSi. Then, a conductive material 130 is formed in the contact holes as shown in FIG. 16. The conductive material 130 includes one or more of Co, Ni, W, Ti, Ta, Cu, Al, TiN and TaN.

It is understood that the FinFETs undergo further CMOS processes to form various features such as contacts/vias, interconnect metal layers, dielectric layers, passivation layers, etc.

In metal gate FinFETs, device performance is affected by a metal gate profile (shape) design, and the metal gate profile is often dependent on the profile of the sacrificial gate electrode. In some embodiments, the device performance includes, a driving current, a threshold voltage, an off-current (Ioff), a switching speed, a power consumption, a drain induced barrier lowering (DIBL) property, or any other electrical properties of the FET device. Different device performances are required for different usages of the FET devices. In view of one or more of the device performance, the required profile of the metal gate is determined. FIGS. 17A, 17B, 17C and 17D show various stages of a sequential process for patterning a sacrificial gate electrode according to an embodiment of the present disclosure. It is understood that additional operations can be provided before, during, and after processes shown by FIGS. 17A-17D, and some of the operations described below can be replaced or eliminated, for additional embodiments of the method. The order of the operations/processes may be interchangeable. Materials, configuration and/or process explained with respect to FIGS. 1-16 can be applied to those for FIGS. 17A-17D and the detailed description thereof will be omitted.

Figure 17A:
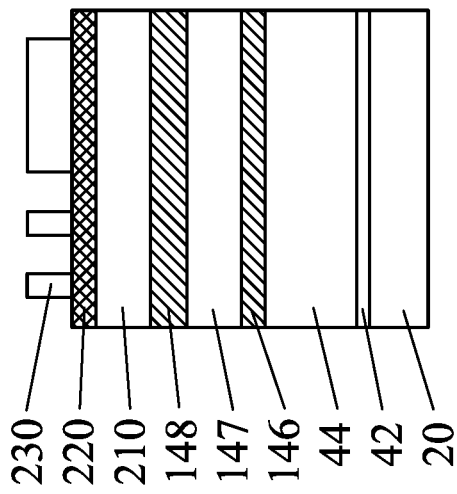
FIGS. 17A, 17B, 17C and 17D show various stages of a sequential process for patterning a sacrificial gate electrode according to an embodiment of the present disclosure.

In some embodiments, as shown in FIG. 17A, after a blanket layer of polysilicon 44 is formed, a first hard mask layer 146, a second hard mask layer 147 and a third hard mask layer 148 are sequentially formed by, for example, CVD or ALD or other suitable film formation methods. In some embodiments, the first hard mask layer 146 is made of one or more of silicon nitride, SiON and SiOCN. In some embodiments, the second hard mask layer 147 is made of different material than the first hard mask layer 146 and is made of one or more of silicon oxide or SiON. In some embodiments, the third hard mask layer 148 is made of a different material than the second hard mask layer 147 and is made of one or more of silicon nitride, SiON and SiOCN. In some embodiments, the thickness of the polysilicon layer 44 is in a range from about 100 nm to about 300 nm, the thickness of the first hard mask layer 146 is in a range from about 10 nm to about 30 nm, the thickness of the second hard mask layer 147 is in a range from about 60 nm to about 100 nm, and the thickness of the third hard mask layer 148 is in a range from about 10 nm to about 30 nm, depending on the device design and process requirements.

Figure 17B:
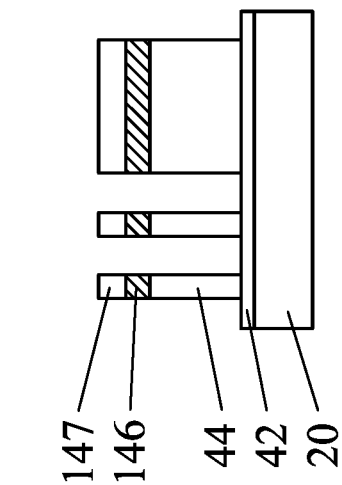

In some embodiments, a tri-layer resist system is employed to pattern a polysilicon layer for a sacrificial gate electrode, as shown in FIG. 17B. The tri-layer resist system includes a bottom layer 210, a middle layer 220 and a photo resist layer 230. In some embodiments, the bottom layer 210 is made of an organic material. The organic material may include a plurality of monomers or polymers that are not cross-linked. The bottom layer 210 may contain a material that is patternable and/or have a composition tuned to provide anti-reflection properties. Exemplary materials for the bottom layer 210 include carbon backbone polymers, such as polyhydroxystyrene (PHS), poly methyl methacrylate (PMMA), polyether, and combinations thereof, and other organic polymers containing aromatic rings. The bottom layer 210 is used to planarize the structure, as the underlying structure may be uneven. In some embodiments, the bottom layer 210 is formed by a spin coating process. In other embodiments, the bottom layer 210 is formed by another suitable deposition process. The thickness of the bottom layer 210 is in a range from about 50 nm to about 200 nm in some embodiments and is in a range from about 80 nm to about 120 nm in other embodiments. In some embodiments, after the bottom layer 210 is formed, an annealing operation is performed.

In some embodiments, the middle layer 220 is formed by spin-coating a silicon containing solution over the bottom layer, and the coated layer is baked at 80-120° C. for 30 sec to 120 sec. In some embodiments, the baking of the coated layer is performed on a baking plate. The thickness of the middle layer 220 is in a range from about 20 nm to about 100 nm in some embodiments, and is in a range from about 30 nm to about 80 nm in other embodiments. In some embodiments, the middle layer 220 further includes an organic polymer. The organic polymer includes a silicon containing polymer in some embodiments, and includes an organic polymer and a cross-linker in other embodiments. In certain embodiments, the silicon containing polymer further includes a chromophore (dye), a photo acid generator, a base quencher and/or fluorocarbon. The organic polymer backbone can be polyhydroxystyrene (PHS), poly methyl methacrylate (PMMA), polyether, and combinations thereof, and other organic polymers containing aromatic rings.

In some embodiments, after the middle layer 220 is formed, a thermal operation, such as an annealing operation is performed. The annealing operation is performed in addition to or instead of the baking operation as set forth above. The annealing operation makes the surface of the coated middle layer 220 smooth or flat. After the annealing, the surface roughness Ra of the middle layer 220 is more than 0 nm and less than 5 nm in some embodiments.

In some embodiments, a temperature of the annealing operation is in a range from about 250° C. to about 600° C. as a substrate temperature, and is in a range from about 300° C. to about 500° C. in other embodiments. In some embodiments, the annealing operation is thermal baking on a baking plate. In such a case, a process time of the thermal baking is in a range from about 30 sec to about 600 sec in some embodiments, and is in a range from about 60 sec to about 300 sec in other embodiments. In some embodiments, the annealing operation includes 2 steps including a first step at a first temperature and a second step at a second temperature higher than the first temperature. The first temperature is in a range from about 80° C. to about 200° C. and the second temperature is in a range from about 250° C. to about 1000° C. in some embodiments.

After the annealing operation, the thickness of the middle layer 220 is in a range from about 15 nm to about 90 nm in some embodiments, and is in a range from about 20 nm to about 70 nm on other embodiments.

Further, as shown in FIG. 17B, a photo resist layer is formed over the middle layer 220 and is patterned into a photo resist pattern 230. A photo resist layer is spin-coated on the middle layer, and the photo resist layer is exposed with an exposure light/beam through a photo mask in some embodiments. The exposure light/beam can be deep ultra violet (DUV) light, such as KrF excimer laser light and ArF excimer laser light, extreme ultra violet (EUV) light having a wavelength around 13.5 nm, an X-ray, and/or electron beam. In some embodiments, multiple exposure processes are applied. In some embodiments, the photo resist pattern 230 includes fine patterns (e.g., about 5 nm to about 20 nm) and large patterns (e.g., about 100 nm or more (e.g., 10 µm)). By using an EUV lithography, the fine patterns and the large patterns can be patterned at the same time (e.g., single exposure). After development of the exposed photo resist, the resist pattern 230 is obtained. In some embodiments, an adhesion layer is disposed between the middle layer 220 and the photo resist layer 230.

Then, the middle layer 220 is patterned to form a patterned middle layer by using the photo resist pattern 230 as an etching mask. Further, the bottom layer 210 is patterned to form a patterned bottom layer by using the patterned middle layer as an etching mask. When the bottom layer 210 is made of organic material, one or more dry etching operations using $O_2$, $SO_2$, $CO_2$ and/or other suitable etching gas are employed to pattern the bottom layer 30.

Figure 17C:
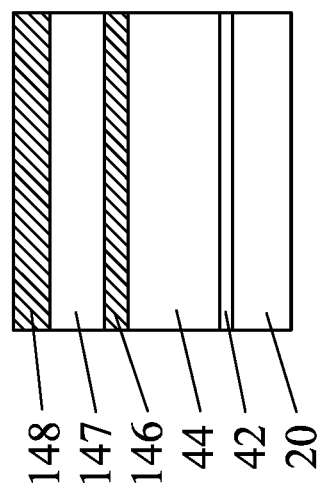

Subsequently, as shown in FIG. 17C, the first to third hard mask layer are patterned to form a hard mask pattern 140 by using the patterned middle layer and the patterned bottom layer as an etching mask. In some embodiments, the third hard mask layer 148 is patterned by using the patterned middle layer and the patterned bottom layer as an etching mask, and then the second hard mask pattern is patterned by using the patterned third hard mask layer as an etching mask, and further the first hard mask pattern is patterned by using the patterned second and third hard mask layers as an etching mask. In some embodiments, when the third and first hard mask layers are made of the same material (e.g., silicon nitride), during the patterning the first hard mask layer 146, the third hard mask layer 148 is removed.

Figure 17D:
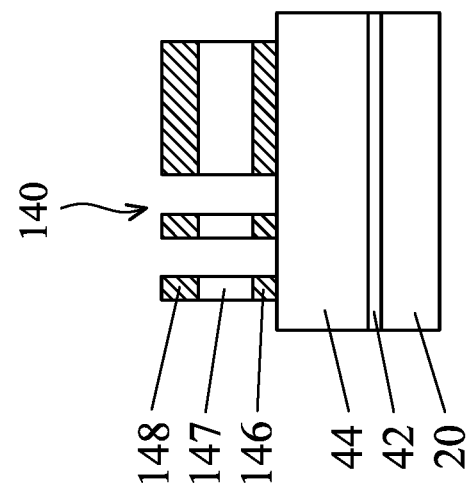

Then, as shown in FIG. 17D, the polysilicon layer 44 is patterned by using the hard mask pattern 140 (or the patterned second and first hard mask layer if the third hard mask layer is removed) as an etching mask. In the present disclosure, a chamber coating technique is employed to control the profile of the etched polysilicon pattern 44.

Figure 18:
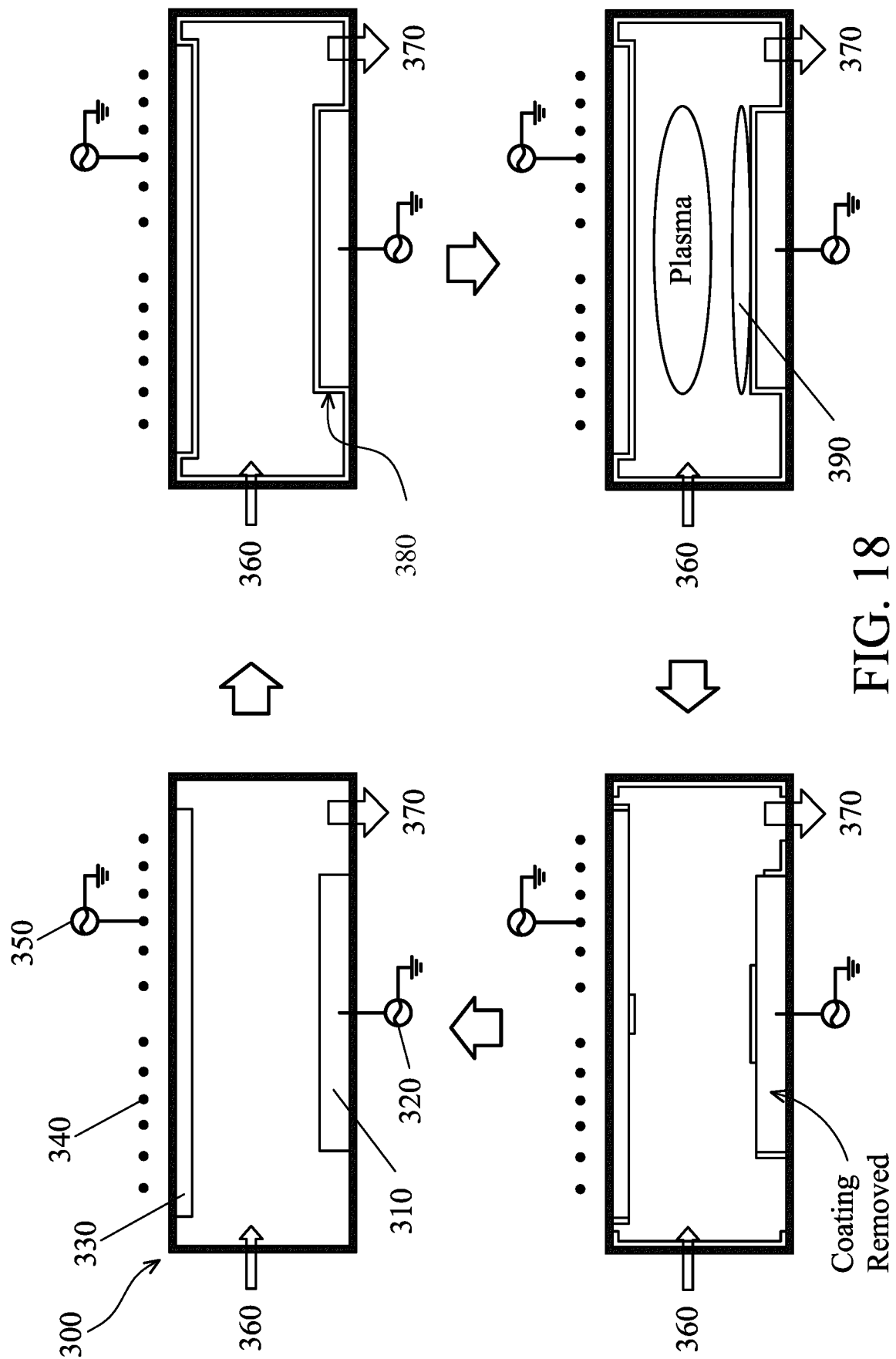
FIG. 18 shows a polysilicon etching process according to an embodiment of the present disclosure.

FIG. 18 illustrates a chamber coating technique to control the polysilicon etching to suppress wafer-to-wafer variation. The chamber 300 is a plasma etching vacuum chamber including a wafer stage 310 coupled to a bias voltage source 320, an upper plate 330, a power supply electrode 340 coupled to a high-frequency power source 350, one or more gas inlets 360 and one or more gas outlets 370 coupled to one or more vacuum pumps.

First, the inside the chamber is cleaned before a wafer to be processed is introduced, as shown in the upper left side of FIG. 18. The cleaning includes generating plasma inside the chamber 300.

Then, the inner wall and the surfaces of the wafer stage 310 and the upper plate 330 are coated by a coating material 380 as shown. The coating material 380 is formed by using plasma with a mixed gas of a silicon source gas ($SiCl_4$, $SiHCl_3$, $SiH_2Cl_2$ and/or $SiH_3Cl$), $O_2$ and Ar in some embodiments. In certain embodiments, $SiCl_4$ is used as the silicon source gas. By using the mixed gas, the coating material represented by $Si_xO_y$ is formed inside the chamber 500. In some embodiments, the coating material is a polymer.

In some embodiments, the pressure for forming the coating material is in a range from about 1 mTorr to about 100 mTorr. In some embodiments, the input electric power is in a range from about 300 W to 800 W. In some embodiments, a flow rate of oxygen is in a range from about 100 sccm to 300 sccm. In some embodiments, a flow rate of silicon source gas (e.g., $SiCl_4$) is in a range from about 20 sccm to 100 sccm. In some embodiments, a flow rate of Ar is in a range from about 100 sccm to 300 sccm. A process time for forming the coating material in in a range from about 5 sec to about 30 sec.

After the coating material 380 is formed, a wafer 390 is loaded on the wafer stage 310 and an etching operation is performed. During the etching operation, a part of the coating material 380 is removed. After the processed wafer is unloaded, a cleaning operation to remove the residual coating material is performed. In the chamber coating technique, every time a wafer is loaded, a new coating is formed, and thus it is possible to suppress the wafer-to-wafer variation in the polysilicon etching.

As the etching of the polysilicon layer by plasma progresses, part of the coating material layer is also etched, and in some embodiments, a part of the inner surface of the vacuum chamber is exposed. When the part of the coating material layer is removed, the etching condition changes and thus the profile (shape) of the etched polysilicon pattern changes. The inventors of the present disclosure have found that controlling conditions for forming the coating material controls properties of the coating material, and thus it is possible to control a profile of the polysilicon sacrificial gate electrode.

Figure 19B:
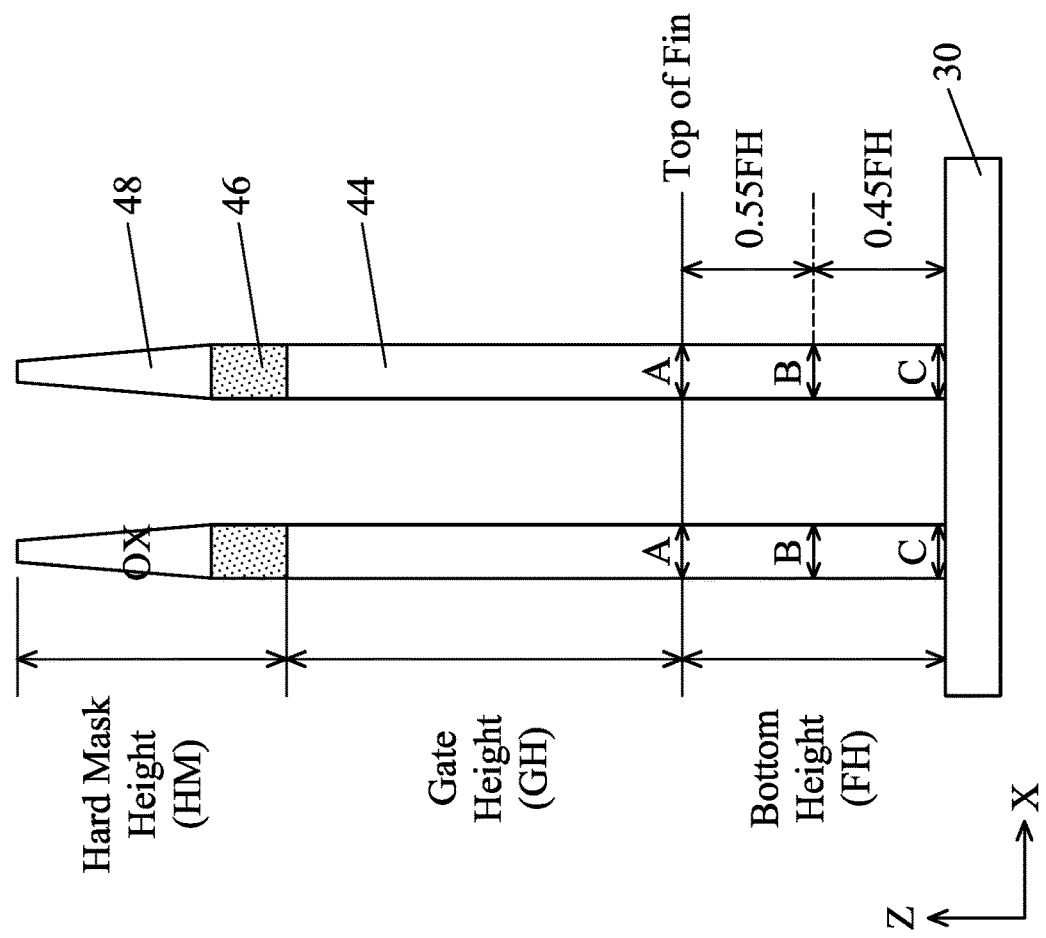
FIGS. 19A and 19B show a profile of a sacrificial gate electrode according to an embodiment of the present disclosure.
Figure 19A:
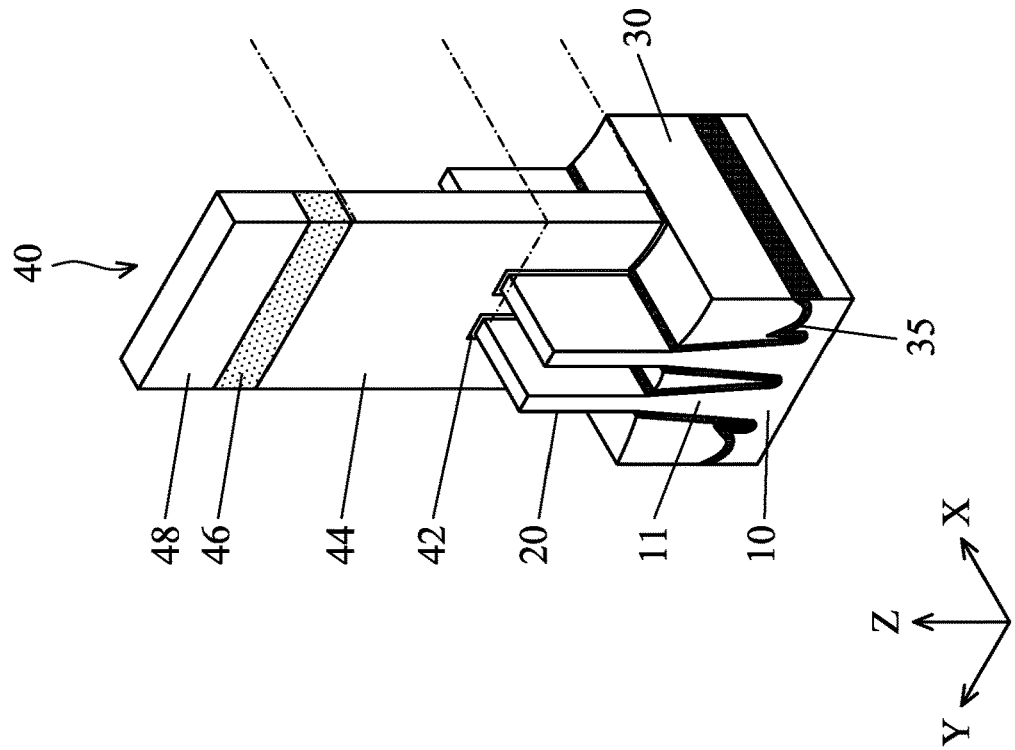

FIG. 19A is the same as FIG. 7 and shows the patterned sacrificial gate electrode 44 with the hard mask layers 46 and 48. FIG. 19B shows a pattern profile of the sacrificial gate electrode 44 with the hard mask layers 46 and 48. Although FIG. 19A shows one sacrificial gate electrode and FIG. 19B shows two for purpose of explanation, the numbers of the sacrificial gate electrodes is not limited to one or two.

The sacrificial gate electrode 44 has a lower portion lower than the top of the fin structure 25 and an upper portion. In some embodiments the lower portion has a vertical length FH from the surface of the isolation insulating layer 30 and the level of the top of the fin structure 25 (i.e., the height of the channel region of upper portion of the fin structure 20 protruding from the isolation insulating layer) and the upper portion has a vertical length GH. In some embodiments, GH is in a range from about 1.5FH to 3FH. In some embodiments, the vertical length HM of the hard mask layers is in a range from about 1.2FH to about 2FH.

In the present disclosure, by controlling the conditions of forming the coating material, the widths A, B and C of the polysilicon layer at the lower portion are controlled. The width A is measured at the level of the top of the fin structure 20 and the width C is measured at the bottom of the polysilicon layer at the surface of the isolation insulating layer 30. The width B is a width corresponding to a level of 0.45FH from the surface of the isolation insulating layer 30.

Figure 20A:
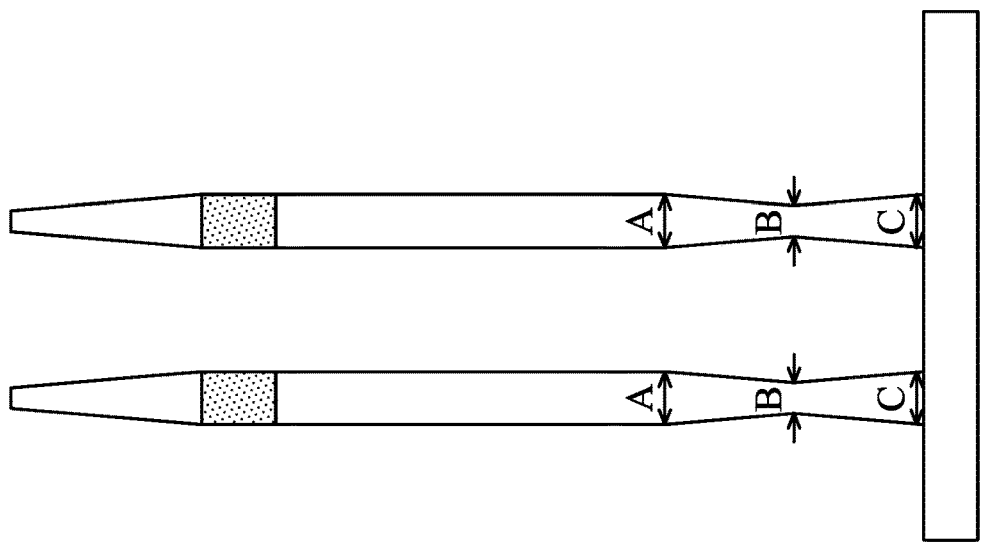
FIGS. 20A, 20B and 20C show various profiles of a sacrificial gate electrode according to embodiments of the present disclosure.

In FIG. 20A, the lower portion of the sacrificial gate electrode has a pincushion shape. The width A is greater than widths B and C and width B is smaller than width C. In some embodiments, width B is about 7-9% smaller than width A (0.91-0.93 of width A), and width C is about 5-6% smaller than width A. In some embodiments, the lower portion of the sacrificial gate electrode has a reverse tapered shape where width C is smaller than width B which is smaller than width A. In some embodiments, the narrowest portion is located at the level of about 0.4FH to about 0.5FH from the upper surface of the isolation insulating layer 30.

Figure 20B:
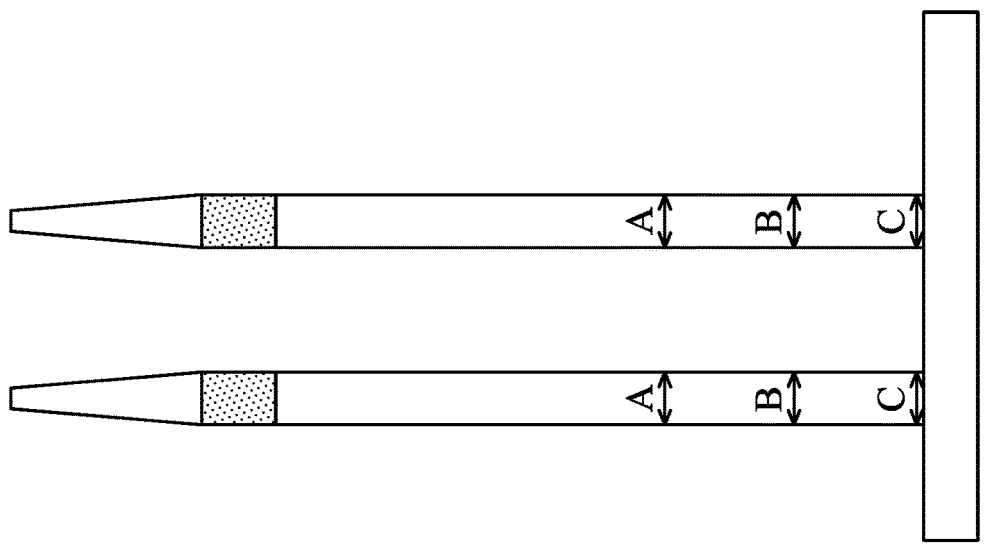

In FIG. 20B, the lower portion of the sacrificial gate electrode has a rectangular shape. The widths A, B and C are substantially equal to each other. In some embodiments, the variation of the widths is equal to or greater than zero and less than about 2% of width A.

Figure 20C:
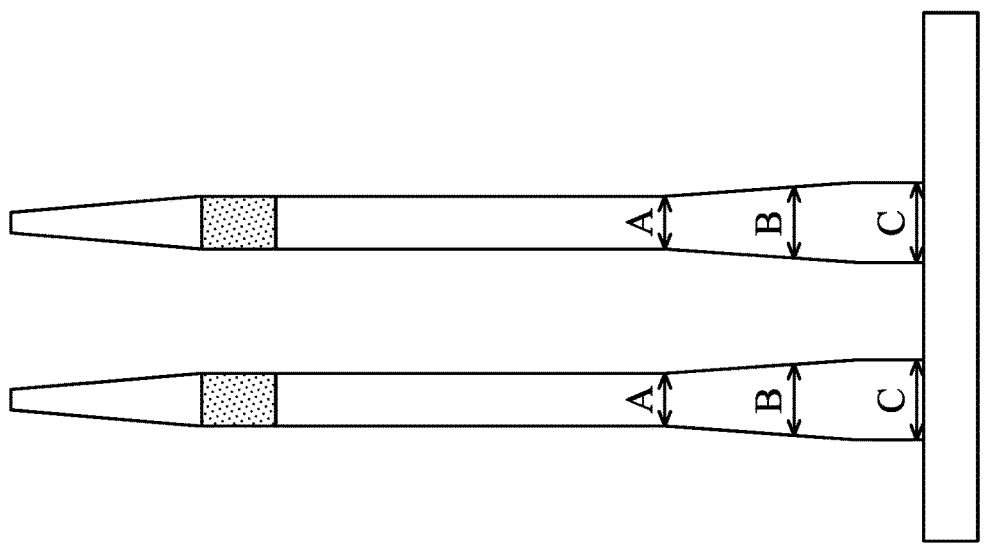

In FIG. 20C, the lower portion of the sacrificial gate electrode has a tapered shape. The width A is smaller than widths B and C and width B is smaller than width C. In some embodiments, width B is about 13-17% greater than width A and width C is about 17-20% greater than width A. In some embodiments, the widest portion is located at the level of about 0 to about 0.1FH from the upper surface of the isolation insulating layer 30.

As explained below, the shape of the sacrificial gate electrode 44 corresponds to the shape of the metal gate electrode. Depending on the design, process and/or electrical performance requirements, one of the shapes of FIG. 20A, 20B or 20C is selected.

The shapes or profiles of the lower portion of the sacrificial gate electrode 44 is controlled by changing one or more of process conditions. The conditions include pressure during the coating material formation, gas flow rates, gas flow ratios, and input electric power.

In some embodiments, as shown in FIG. 21, a pressure for forming the coating material is controlled to control the properties of the coating material, and thus control the profile of the lower portion of the sacrificial gate electrode 44. When the pressure is relatively low, in a range from about 5 mTorr to about 10 mTorr, the density of the coating material is higher, and thus the etching (trimming) rate of the coating material during the etching of the polysilicon layer is low. In some embodiments, in case 1, the etching rate is in a range from about 0.5 nm/s to about 1.0 nm/s, in case 2, the etching rate is in a range from about 1.0 nm/s to about 1.7 nm/s, and in case 3, the etching rate is in a range from about 1.5 nm/s to about 2.5 nm/s, as shown in FIG. 21. In some embodiments, in case 4, the etching rate is in a range from about 0.3 nm/s to about 0.7 nm/s, in case 5, the etching rate is in a range from about 0.7 nm/s to about 1.5 nm/s, and in case 6, the etching rate is in a range from about 1.7 nm/s to about 2.5 nm/s, as shown in FIG. 22.

Further, the thickness of the coating material is low and the thickness uniformity of the coating material is high (low variation). When the polysilicon layer is etched with the coating material formed by this condition, the shape of the lower portion of the patterned sacrificial gate electrode has a pincushion shape.

When the pressure increases, the density of the coating material decreases, and the trimming/etching rate of the coating material increases. By increasing the pressure, the lower portion of the sacrificial gate electrode has a rectangular shape or a tapered shape.

In some embodiments, as shown in FIG. 22, a gas flow ratio (SiCl$_4$/O$_2$) for forming the coating material is controlled to control the properties of the coating material, and thus controlling the profile of the lower portion of the sacrificial gate electrode 44. When the silicon source gas is relatively small, in a range from about 0.05 to about 0.2 (relative to O$_2$ amount), the density of the coating material is higher, and thus the etching (trimming) rate of the coating material during the etching of the polysilicon layer is low. Further, the thickness of the coating material is low and the thickness uniformity of the coating material is high (low variation). When the polysilicon layer is etched with the coating material formed by this condition, the shape of the lower portion of the patterned sacrificial gate electrode has a pincushion shape.

When the gas ratio increases, the density of the coating material decreases, and the trimming/etching rate of the coating material increases. By increasing the gas ratio, the lower portion of the sacrificial gate electrode has a rectangular shape or a tapered shape.

The thickness of the coating material is also adjusted by adjusting the process time, and depends on a thickness of the polysilicon layer to be etched.

FIG. 23 shows profiles of the lower portions of the sacrificial gate electrode 44, the gate space 49 (see, FIG. 12), and the gate electrode 104 (see, FIG. 13) with respect to the coating material formation conditions. The conditions 1-6 are shown in FIGS. 21 and 23.

In conditions 1 and 4, the sacrificial gate electrode has a pincushion shape. In some embodiments, a ratio of width B to width A of the sacrificial gate electrode is in a range from about 0.92 to 0.94, and a ratio of width A, width B and width C is 1:about 0.92 to about 0.94:about 0.94 to about 0.96. The gate space 49 also has a pincushion shape. In some embodiments, a ratio of width B to width A of the gate space is in a range from about 0.83 to 0.91, and a ratio of width A, width B and width C is 1:about 0.83 to about 0.91:about 0.92 to about 1. The gate electrode 104 also has a pincushion shape. In some embodiments, a ratio of width B to width A of the gate electrode is in a range from about 0.73 to 0.81, and a ratio of width A, width B and width C is 1:about 0.73 to about 0.81:about 0.82 to about 0.88.

In conditions 2 and 5, the sacrificial gate electrode has a rectangular shape. In some embodiments, a ratio of width B to width A of the sacrificial gate electrode 44 is in a range from about 0.98 to 1, and a ratio of width A, width B and width C is 1:about 0.98 to about 1:about 0.98 to about 1. The gate space 49 also has a rectangular shape. In some embodiments, a ratio of width B to width A of the gate space is in a range from about 0.90 to 1.04, and a ratio of width A, width B and width C is 1:about 0.90 to about 1.04:about 0.93 to about 1.07. The gate electrode 104 also has a rectangular shape. In some embodiments, a ratio of width B to width A of the gate electrode is in a range from about 0.95 to 1.09, and a ratio of width A, width B and width C is 1:about 0.95 to about 1.09:about 1 to about 1.14. In some embodiments, the variation of the widths of the gate electrode is greater than zero.

In conditions 3 and 6, the sacrificial gate electrode has a tapered shape. In some embodiments, a ratio of width B to width A of the sacrificial gate electrode 44 is in a range from about 1.08 to 1.16, and a ratio of width A, width B and width C is 1:about 1.08 to about 1.16:about 1.12 to about 1.2. The gate space 49 also has a tapered shape. In some embodiments, a ratio of width B to width A of the gate space is in a range from about 1.04 to 1.24, and a ratio of width A, width B and width C is 1:about 1.04 to about 1.24:about 1.13 to about 1.33. The gate electrode 104 also has a tapered shape. In some embodiments, a ratio of width B to width A of the gate electrode is in a range from about 0.95 to 1.09, and a ratio of width A, width B and width C is 1:about 1.17 to about 1.27:about 1.2 to about 1.3.

In some embodiments, a seam of a void exist in the metal gate structure, for example, at the widest portion of the metal gate structure. In some embodiments, the bottom of the metal gate structure has rounded corners and in such a case, the width C is measured at a level 2-3 nm higher than the bottommost portion of the metal gate structure. In some embodiments, the metal gate structure includes more than one layers and thickness of each of the layers on the inner sidewall (vertical portion) is not uniform in the metal gate structure. In some embodiments, the variation of the thickness is more than 0% and less than 10% with respect to the average thickness thereof.

The various embodiments or examples described herein offer several advantages over the existing art. In the embodiments of the present disclosure, a coating material layer is formed on inside the etching chamber before performing polysilicon etching, and the conditions for forming the coating material are adjusted to control the profile (shape) of the etched polysilicon. By controlling the profile of the polysilicon pattern (sacrificial gate electrode), it is possible to control the profile of the gate electrode subsequently formed, which can improve device performance and yield.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a fin structure protruding from an isolation insulating layer disposed over a substrate is formed, a sacrificial gate dielectric layer is formed over the fin structure, a polysilicon layer is formed over the sacrificial gate dielectric layer, a mask pattern is formed over the polysilicon layer, and the polysilicon layer is patterned into a sacrificial gate electrode using the mask pattern as an etching mask. In the patterning the polysilicon layer, a coating material layer is formed on an inner wall of an etching chamber, the substrate with the polysilicon layer is loaded into the etching chamber, the polysilicon layer is etched by plasma dry etching, the substrate is unloaded after the plasma dry etching from the etching chamber, and residual coating material layer is removed from the inner wall of the etching chamber. In one or more of the foregoing and following embodiments, the coating material layer includes $Si_xO_y$ and is formed from a gas containing a silicon source gas and oxygen. In one or more of the foregoing and following embodiments, the silicon source gas is $SiCl_4$. In one or more of the foregoing and following embodiments, the sacrificial gate electrode includes a lower portion below a level of a top of the fin structure and above an upper surface of the isolation insulating layer and an upper portion above the lower portion, and the lower portion have a pincushion shape. In one or more of the foregoing and following embodiments, the forming the coating material comprises at least one condition of a pressure in a range from 5 mTorr to 10 mTorr or a flow ratio of $SiCl_4$ to oxygen in a range from 0.05 to 0.2. In one or more of the foregoing and following embodiments, the sacrificial gate electrode includes a lower portion below a level of a top of the fin structure and above an upper surface of the isolation insulating layer and an upper portion above the lower portion, and the lower portion have a tapered shape. In one or more of the foregoing and following embodiments, the forming the coating material comprises at least one condition of a pressure in a range from 30 mTorr to 60 mTorr or a flow ratio of $SiCl_4$ to oxygen in a range from 0.4 to 0.6. In one or more of the foregoing and following embodiments, the sacrificial gate electrode includes a lower portion below a level of a top of the fin structure and above an upper surface of the isolation insulating layer and an upper portion above the lower portion, and a variation in width of the lower portion is more than zero and less than 2% of a width of the fin structure at the level of the top of the fin structure. In one or more of the foregoing and following embodiments, the forming the coating material comprises at least one condition of a pressure in a range from 10 mTorr to 30 mTorr or a flow ratio of $SiCl_4$ to oxygen in a range from 0.2 to 0.4. In one or more of the foregoing and following embodiments, gate sidewall spacers are further formed, a source/drain structure including an epitaxial semiconductor layer is formed, an interlayer dielectric layer is formed, the sacrificial gate electrode and sacrificial gate dielectric layer are removed, and a gate dielectric layer and a gate electrode layer including one or more conductive material layers are formed.

In accordance with another aspect of the present disclosure, in a method of manufacturing a semiconductor device, a polysilicon layer is formed over a substrate, a hard mask pattern is formed over the polysilicon layer, and the polysilicon layer is patterned using the hard mask pattern as an etching mask. In the patterning the polysilicon layer, a profile of the patterned polysilicon layer is determined according to a required device performance, one or more conditions for forming a coating material layer are determined based on the profile, the coating material layer is formed on an inner wall of an etching chamber, the substrate with the polysilicon layer is loaded into the etching chamber, the polysilicon layer is etched by plasma dry etching, the substrate is unloaded after the plasma dry etching from the etching chamber, and residual coating material layer is removed from the inner wall of the etching chamber. In one or more of the foregoing and following embodiments, the coating material layer includes $Si_xO_y$, and is formed from a gas mixture of $SiCl_4$, $O_2$ and Ar. In one or more of the foregoing and following embodiments, the patterned polysilicon layer includes a lower portion an upper portion above the lower portion, and when the determined profile is a pincushion shape in the lower portion, a pressure for forming the coating material layer is set lower than a condition for a rectangular profile in the lower portion. In one or more of the foregoing and following embodiments, the patterned polysilicon layer includes a lower portion an upper portion above the lower portion, and when the determined profile is a pincushion shape in the lower portion, a gas ratio of $SiCl_4$ to $O_2$ is set lower than a condition for a rectangular profile in the lower portion. In one or more of the foregoing and following embodiments, the patterned polysilicon layer includes a lower portion an upper portion above the lower portion, and when the determined profile is a tapered shape in the lower portion, a pressure for forming the coating material layer is set higher than a condition for a rectangular profile in the lower portion. In one or more of the foregoing and following embodiments, the patterned polysilicon layer includes a lower portion an upper portion above the lower portion, and when the determined profile is a tapered shape in the lower portion, a gas ratio of $SiCl_4$ to $O_2$ is set higher than a condition for a rectangular profile in the lower portion. In one or more of the foregoing and following embodiments, in the forming the hard mask pattern, a mask layer including multiple dielectric layers is formed on the polysilicon layer, a tri-layer resist including a bottom layer, a middle layer and a photo resist layer is formed on the mask layer, the photo resist layer is patterned by an EUV lithography into a photo resist pattern, the middle layer and the bottom layer are patterned, and the mask layer is patterned into the hard mask pattern. The photo resist pattern includes smaller patterns less than 20 nm in width and larger patterns more than 100 nm in width.

In accordance with another aspect of the present disclosure, a semiconductor device includes a fin structure protruding from an isolation insulating layer disposed over a substrate and having a channel region, a source/drain region disposed over the substrate, a gate dielectric layer disposed on the channel region, and a gate electrode layer disposed on the gate dielectric layer. The gate electrode includes a lower portion below a level of a top of the channel region and above an upper surface of the isolation insulating layer, and a width of the lower portion is not constant. In one or more of the foregoing and following embodiments, the lower portion has a pincushion shape. In one or more of the foregoing and following embodiments, the lower portion has a tapered shape.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   forming a fin structure protruding from an isolation insulating layer disposed over a substrate;
   forming a sacrificial gate dielectric layer over the fin structure;
   forming a polysilicon layer over the sacrificial gate dielectric layer;
   forming a mask pattern over the polysilicon layer; and
   patterning the polysilicon layer into a sacrificial gate electrode using the mask pattern as an etching mask, wherein:
   the patterning the polysilicon layer includes:
     forming a coating material layer on an inner wall of an etching chamber;
     loading the substrate with the polysilicon layer into the etching chamber;
     etching the polysilicon layer by plasma dry etching;
     unloading the substrate after the plasma dry etching from the etching chamber; and
     removing residual coating material layer from the inner wall of the etching chamber,
   during the etching the polysilicon layer, the coating material layer is partially removed and a part of the inner wall is exposed.

2. The method of claim 1, wherein the coating material layer includes $Si_xO_y$, and is formed from a gas containing a silicon source gas and oxygen.

3. The method of claim 2, wherein the silicon source gas is $SiCl_4$.

4. The method of claim 3, wherein:
   the sacrificial gate electrode includes a lower portion below a level of a top of the fin structure and above an upper surface of the isolation insulating layer and an upper portion above the lower portion, and
   the lower portion has a pincushion shape.

5. The method of claim 4, wherein the forming the coating material comprises at least one condition of a pressure in a range from 5 mTorr to 10 mTorr or a flow ratio of $SiCl_4$ to oxygen in a range from 0.05 to 0.2.

6. The method of claim 3, wherein:
   the sacrificial gate electrode includes a lower portion below a level of a top of the fin structure and above an upper surface of the isolation insulating layer and an upper portion above the lower portion, and
   the lower portion has a tapered shape.

7. The method of claim 6, wherein the forming the coating material comprises at least one condition of a pressure in a range from 30 mTorr to 60 mTorr or a flow ratio of $SiCl_4$ to oxygen in a range from 0.4 to 0.6.

8. The method of claim 3, wherein:
   the sacrificial gate electrode includes a lower portion below a level of a top of the fin structure and above an upper surface of the isolation insulating layer and an upper portion above the lower portion, and
   a variation in width of the lower portion is more than zero and less than 2% of a width of the fin structure at the level of the top of the fin structure.

9. The method of claim 8, wherein the forming the coating material comprises at least one condition of a pressure in a range from 10 mTorr to 30 mTorr or a flow ratio of $SiCl_4$ to oxygen in a range from 0.2 to 0.4.

10. The method of claim 1 further comprising:
    forming gate sidewall spacers;
    forming a source/drain structure including an epitaxial semiconductor layer;
    forming an interlayer dielectric layer;
    removing the sacrificial gate electrode and sacrificial gate dielectric layer; and
    forming a gate dielectric layer and a gate electrode layer including one or more conductive material layers.

11. A method of manufacturing a semiconductor device, comprising:
    forming a polysilicon layer over a substrate;
    forming a hard mask pattern over the polysilicon layer; and
    patterning the polysilicon layer using the hard mask pattern as an etching mask, wherein:
    the patterning the polysilicon layer includes:
      determining a profile of the patterned polysilicon layer according to a required device performance;
      determining one or more conditions for forming a coating material layer based on the profile;
      forming the coating material layer on an inner wall of an etching chamber;
      loading the substrate with the polysilicon layer into the etching chamber;
      etching the polysilicon layer by plasma dry etching to obtain the profile;

unloading the substrate after the plasma dry etching from the etching chamber; and removing residual coating material layer from the inner wall of the etching chamber, and during the etching the polysilicon layer, the coating material layer is partially removed and a part of the inner wall is exposed.

12. The method of claim 11, wherein the coating material layer includes $Si_xO_y$ and is formed from a gas mixture of $SiCl_4$, $O_2$ and Ar.

13. The method of claim 12, wherein:

the patterned polysilicon layer includes a lower portion and an upper portion above the lower portion, and when the determined profile is a pincushion shape in the lower portion, a pressure for forming the coating material layer is set lower than a pressure for forming the coating material for a rectangular profile in the lower portion.

14. The method of claim 12, wherein:

the patterned polysilicon layer includes a lower portion and an upper portion above the lower portion, and when the determined profile is a pincushion shape in the lower portion, a gas ratio of $SiCl_4$ to $O_2$ is set lower than a gas ratio of $SiCl_4$ to $O_2$ for forming the coating material for a rectangular profile in the lower portion.

15. The method of claim 11, wherein:

the patterned polysilicon layer includes a lower portion and an upper portion above the lower portion, and when the determined profile is a tapered shape in the lower portion, a pressure for forming the coating material layer is set higher than a pressure for forming the coating material for a rectangular profile in the lower portion.

16. The method of claim 11, wherein:

the patterned polysilicon layer includes a lower portion and an upper portion above the lower portion, and when the determined profile is a tapered shape in the lower portion, a gas ratio of $SiCl_4$ to $O_2$ is set higher than a gas ratio of $SiCl_4$ to $O_2$ for forming the coating material for a rectangular profile in the lower portion.

17. The method of claim 11, wherein:

the forming the hard mask pattern includes:

forming a mask layer on the polysilicon layer, the mask layer including multiple dielectric layers;

forming a tri-layer resist including a bottom layer, a middle layer and a photo resist layer on the middle layer;

patterning the photo resist layer by EUV lithography to form a photo resist pattern;

patterning the middle layer and the bottom layer; and patterning the mask layer to form the hard mask pattern, and the photo resist pattern includes smaller patterns less than 20 nm in width and larger patterns more than 100 nm in width.

18. A method of manufacturing a semiconductor device, comprising:

forming a fin structure protruding from an isolation insulating layer disposed over a substrate;

forming a sacrificial gate dielectric layer over the fin structure;

forming a polysilicon layer over the sacrificial gate dielectric layer;

forming a mask pattern over the polysilicon layer; and patterning the polysilicon layer into a sacrificial gate electrode using the mask pattern as an etching mask, wherein:

the patterning the polysilicon layer includes:

forming a coating material layer on an inner wall of an etching chamber;

loading the substrate with the polysilicon layer into the etching chamber;

etching the polysilicon layer by plasma dry etching;

unloading the substrate after the plasma dry etching from the etching chamber; and removing residual coating material layer from the inner wall of the etching chamber, and during the etching the polysilicon layer, the coating material layer is etched at an etching rate is in a range from 0.5 nm/s to 1.0 nm/s.

19. The method of claim 18, wherein during the etching the polysilicon layer, a part of the inner wall is exposed.

20. The method of claim 18, wherein a thickness of the coating material layer as formed is in a range from 10 nm to 50 nm.

* * * * *